(12) United States Patent
Huang et al.

(10) Patent No.: US 10,868,115 B2
(45) Date of Patent: Dec. 15, 2020

(54) HIGH VOLTAGE DEVICE AND MANUFACTURING METHOD THEREOF

(71) Applicant: RICHTEK TECHNOLOGY CORPORATION, Zhubei (TW)

(72) Inventors: Tsung-Yi Huang, Hsinchu (TW); Chu-Feng Chen, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 10 days.

(21) Appl. No.: 16/449,350

(22) Filed: Jun. 22, 2019

(65) Prior Publication Data

US 2020/0044022 A1 Feb. 6, 2020

(30) Foreign Application Priority Data

Aug. 6, 2018 (TW) .............................. 107127270 A

(51) Int. Cl.
| | |
|---|---|
| *H01L 29/06* | (2006.01) |
| *H01L 29/66* | (2006.01) |
| *H01L 29/78* | (2006.01) |
| *H01L 21/762* | (2006.01) |

(52) U.S. Cl.
CPC .... *H01L 29/0649* (2013.01); *H01L 21/76202* (2013.01); *H01L 29/66681* (2013.01); *H01L 29/7816* (2013.01)

(58) Field of Classification Search
CPC ........... H01L 29/0649; H01L 29/66681; H01L 29/7816; H01L 21/76202
See application file for complete search history.

(56) References Cited

U.S. PATENT DOCUMENTS

| | | | |
|---|---|---|---|
| 9,853,099 B1* | 12/2017 | Huang | ................ H01L 29/7816 |
| 2019/0067471 A1* | 2/2019 | Huang | ................ H01L 29/0649 |
| 2020/0118998 A1* | 4/2020 | Kim | ................ H01L 21/823462 |

* cited by examiner

*Primary Examiner* — Christine A Enad
(74) *Attorney, Agent, or Firm* — Tung & Associates

(57) ABSTRACT

A high voltage device includes: a semiconductor layer, an isolation region, a deep well, a buried layer, a first high voltage well, a first conductivity type well, a second high voltage well, a body region, a body contact, a deep well column, a gate, a source and a drain. The deep well column is located between the drain and a boundary of the conductive layer which is near the source in a channel direction. The deep well column is a minority carriers absorption channel, to avoid turning ON a parasitic transistor in the high voltage device.

10 Claims, 13 Drawing Sheets

HIGH VOLTAGE DEVICE AND MANUFACTURING METHOD THEREOF

CROSS REFERENCES

The present invention claims priority to TW 107127270 filed on Aug. 6, 2018.

BACKGROUND OF THE INVENTION

Field of Invention

The present invention relates to a high voltage device and a manufacturing method thereof; particularly, it relates to such high voltage device which can avoid turning ON a parasitic transistor therein, and a manufacturing method thereof.

Description of Related Art

FIGS. 1A and 1B show schematic diagrams of a cross-section view and a top-view of a prior art high voltage device 100, respectively. In the context of the present invention, a "high voltage" device refers a device which needs to withstand a voltage over 5V on a drain thereof in normal operation. Typically, the high voltage device 100 has a drift region 12a (as indicated by the dashed frame shown in FIG. 1B) which separates the drain 19 and the body region 16 of the high voltage device 100, wherein a lateral length of the drift region 12a is determined according to the threshold voltage that the high voltage device 100 is designed to operate by.

As shown in FIGS. 1A and 1B, the high voltage device 100 includes: a well 12, an isolation region 13, a drift oxide region 14, a body region 16, a body contact 16', a gate 17, a source 18, and a drain 19. The well 12 has a conductivity type of N-type, and is formed on a substrate 11. The isolation region 13 is a local oxidation of silicon (LOCOS) structure, for defining a device region 13a which is an active area for an operation of the high voltage device 100. The device region 13a has a range which is indicated by the bold dashed frame in FIG. 1A. The gate 17 overlays a part of the drift oxidation region 14.

When the high voltage device 100 operates, holes (minority carriers of the hot carriers) caused by high electric field are injected into the body contact 16' via the body region 16. A current which is formed by the minority carriers will increase a forward voltage between the body region 16 and the source 18, to turn ON a parasitic NPN transistor formed by the source 18, the body region 16 and the well 12, whereby the safe operation area (SOA) becomes narrow. The definition of SOA is well known by those skilled in the art, so it is not redundantly explained here. Besides, the capacitance of the PN junction formed between the body region 16 and the well 12 may be too high to form a shift current between the source 18 and the body region 16 as a transient response during operation of the high voltage device 100, wherein the drift current may turn ON the parasitic transistor.

In view of the above, to overcome the drawbacks in the prior art, the present invention provides a high voltage device and a manufacturing method thereof can avoid turning ON a parasitic transistor therein.

SUMMARY OF THE INVENTION

From one perspective, the present invention provides a high voltage device comprising: a semiconductor layer, which is formed on a substrate, and has a top surface and a bottom surface opposite to the top surface in a vertical direction; an isolation region, which is formed on and in contact with the top surface, wherein the isolation region is for defining a device region; a deep well which has a first conductivity type and is formed in the semiconductor layer; a buried layer which has a second conductivity type and is formed below the deep well in the semiconductor layer, wherein the buried layer encompasses a lower boundary of the deep well, and is in contact with the deep well; a first high voltage well which has the second conductivity type and is formed on the deep well in the semiconductor layer, wherein the first high voltage well overlays an upper boundary of the deep well and is in contact with the deep well, and the first high voltage well is below and in contact with the top surface in the vertical direction; a first conductivity type well which has the first conductivity type and is formed in the first high voltage well outside the device region, wherein the first conductivity type well is located below and in contact with the top surface in the vertical direction, and wherein the first conductivity type well is in contact with the deep well and is electrically connected to the deep well; a second high voltage well which has the second conductivity type and is formed in the first high voltage well outside the device region, wherein the second high voltage well is located below and in contact with the top surface in the vertical direction, and wherein the second high voltage well is in contact with the buried layer and is electrically connected to the buried layer; a body region which has the first conductivity type and is formed in the first high voltage well within the device region, wherein the body region is located below and in contact with the top surface in the vertical direction; a body contact which has the first conductivity type and is formed in the body region, wherein the body contact is located below and in contact with the top surface in the vertical direction, and wherein the body contact serves as an electrical contact of the body region; a deep well column which has the first conductivity type and is formed in the first high voltage well within the device region, wherein the deep well column is in contact with the deep well and is electrically connected to the deep well, and wherein the deep well column is not in contact with the top surface in the vertical direction; a gate, which is formed on the top surface within the device region, wherein part of the first high voltage well is located below and in contact with the gate in the vertical direction, the gate including: a dielectric layer, which is formed on and in contact with the top surface, and is in contact with the first high voltage well in the vertical direction; a conductive layer, which is formed on and in contact with the dielectric layer, and serves as an electrical contact of the gate; and a spacer layer, which is formed outside of two sidewalls of the conductive layer, and serves as an electrical insulation layer of the gate; and a source and a drain which have the second conductivity type and are formed below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the first high voltage well outside the drain side; wherein an inversion region is formed in the body region between the source and the first high voltage well in a channel direction to serve as an inversion current channel in an ON operation of the high voltage device; wherein a drift region is formed in the first high voltage well between the drain and the body region in the channel direction to serve as a drift current channel in the ON operation of the high voltage device; wherein the deep well column is located between the drain and a boundary of the conductive layer near the source side in the channel direction.

From another perspective, the present invention provides a manufacturing method of a high voltage device, comprising: forming a semiconductor layer on a substrate, wherein the semiconductor layer has a top surface and a bottom surface opposite to the top surface in a vertical direction; forming an isolation region on the top surface for defining a device region, wherein the isolation region is in contact with the top surface; forming a deep well having a first conductivity type in the semiconductor layer; forming a buried layer having a second conductivity type below the deep well in the semiconductor layer, wherein the buried layer encompasses a lower boundary of the deep well, and is in contact with the deep well; forming a first high voltage well having the second conductivity type on the deep well in the semiconductor layer, wherein the first high voltage well overlays an upper boundary of the deep well and is in contact with the deep well, and wherein the first high voltage well is below and in contact with the top surface in the vertical direction; forming a first conductivity type well having the first conductivity type in the first high voltage well outside the device region, wherein the first conductivity type well is located below and in contact with the top surface in the vertical direction, and wherein the first conductivity type well is in contact with the deep well and is electrically connected to the deep well; forming a second high voltage well having the second conductivity type in the first high voltage well outside the device region, wherein the second high voltage well is located below and in contact with the top surface in the vertical direction, and wherein the second high voltage well is in contact with the buried layer and is electrically connected to the buried layer; forming a body region having the first conductivity type in the first high voltage well within the device region, wherein the body region is located below and in contact with the top surface in the vertical direction; forming a body contact having the first conductivity type in the body region, wherein the body contact is located below and in contact with the top surface in the vertical direction, and wherein the body contact serves as an electrical contact of the body region; forming a deep well column having the first conductivity type in the first high voltage well within the device region, wherein the deep well column is in contact with the deep well and is electrically connected to the deep well, and wherein the deep well column is not in contact with the top surface in the vertical direction; forming a gate on the top surface within the device region, wherein part of the first high voltage well is located below and in contact with the gate in the vertical direction, the gate including: a dielectric layer, which is formed on and in contact with the top surface, and is in contact with the first high voltage well in the vertical direction; a conductive layer, which is formed on and in contact with the dielectric layer, and serves as an electrical contact of the gate; and a spacer layer, which is formed outside of two sidewalls of the conductive layer, and serves as an electrical insulation layer of the gate; and forming a source and a drain having the second conductivity type below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the first high voltage well outside the drain side; wherein an inversion region is formed in the body region between the source and the first high voltage well in a channel direction to serve as an inversion current channel in an ON operation of the high voltage device; wherein a drift region is formed in the first high voltage well between the drain and the body region in the channel direction to serve as a drift current channel in the ON operation of the high voltage device; wherein the deep well column is located between the drain and a boundary of the conductive layer near the source side in the channel direction.

In one preferable embodiment, the high voltage device further includes a drift oxide region, which is formed on and in contact with the top surface, and is on and in contact with the drift region within the device region, wherein the drift oxide region includes a local oxidation of silicon (LOCOS) structure, a shallow trench isolation (STI) structure, or a chemical vapor deposition (CVD) structure.

In one preferable embodiment, an upper boundary of the deep well column is deeper than a lower boundary of the body region in the vertical direction.

In one preferable embodiment, the source, the body region, and the first high voltage well form a parasitic transistor, and the deep well column serves as a minority carriers absorption channel, to avoid turning ON the parasitic transistor.

In one preferable embodiment, the high voltage device further includes: a first conductivity type contact which has the first conductivity type and is formed in the first conductivity type well, wherein the first conductivity type contact is located below and in contact with the top surface in the vertical direction, to serve as an electrical contact of the first conductivity type well; and a second conductivity type contact which has the second conductivity type and is formed in the second conductivity type well, wherein the second conductivity type contact is located below and in contact with the top surface in the vertical direction, to serve as an electrical contact of the second conductivity type well.

The objectives, technical details, features, and effects of the present invention will be better understood with regard to the detailed description of the embodiments below.

DESCRIPTION OF THE PREFERABLE EMBODIMENTS

The drawings as referred to throughout the description of the present invention are for illustration only, to show the interrelations among the process steps and the layers, while the shapes, thicknesses, and widths are not drawn in actual scale.

Figure 1A:
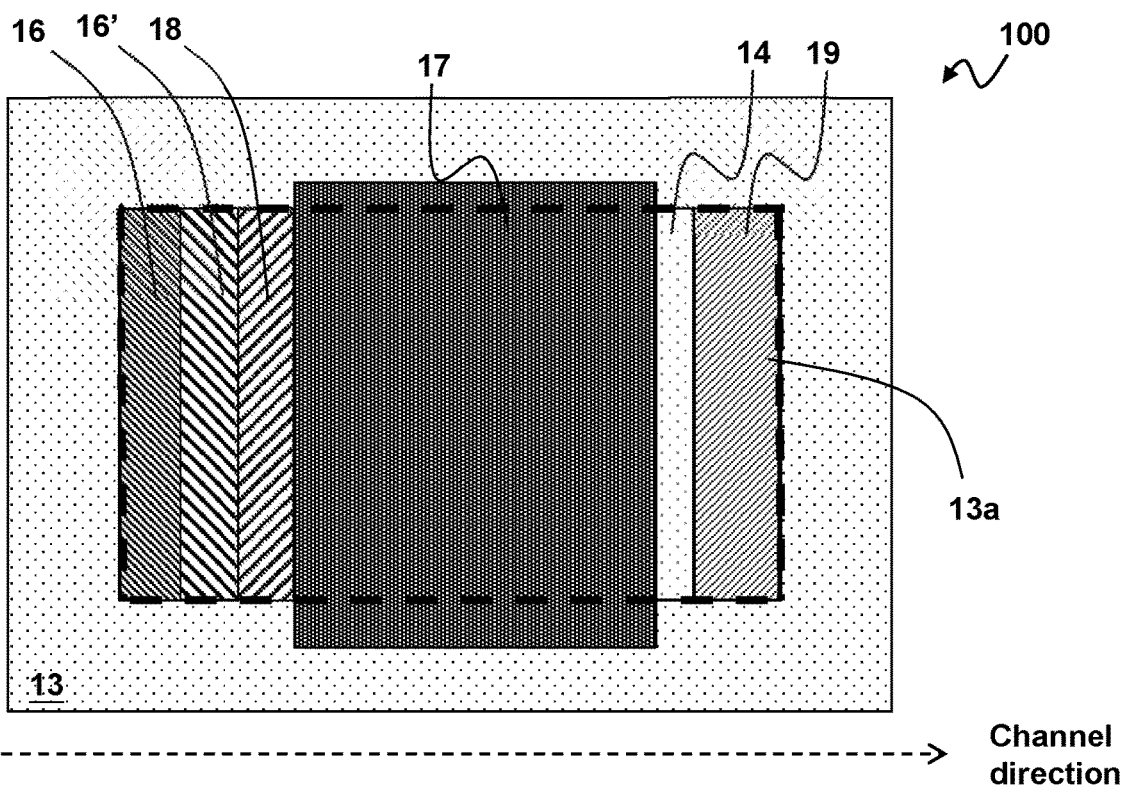
FIGS. 1A and 1B show a top view and a cross-section view of a conventional high voltage device 100, respectively.
Figure 1B:
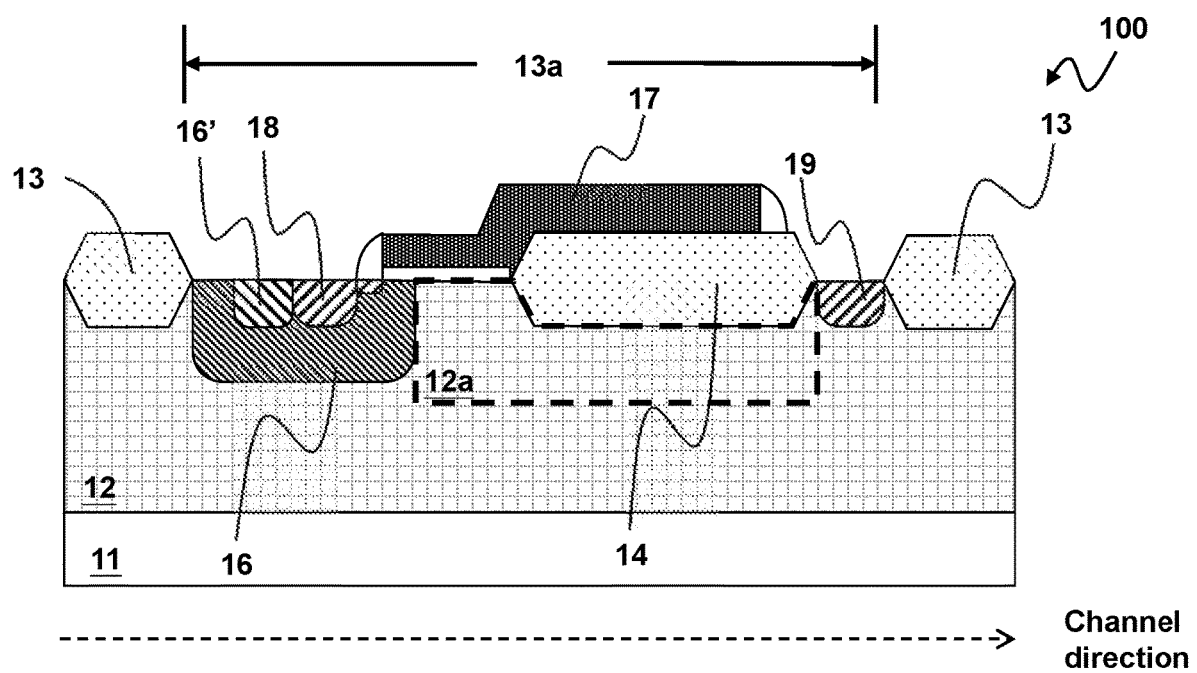
Figure 2:
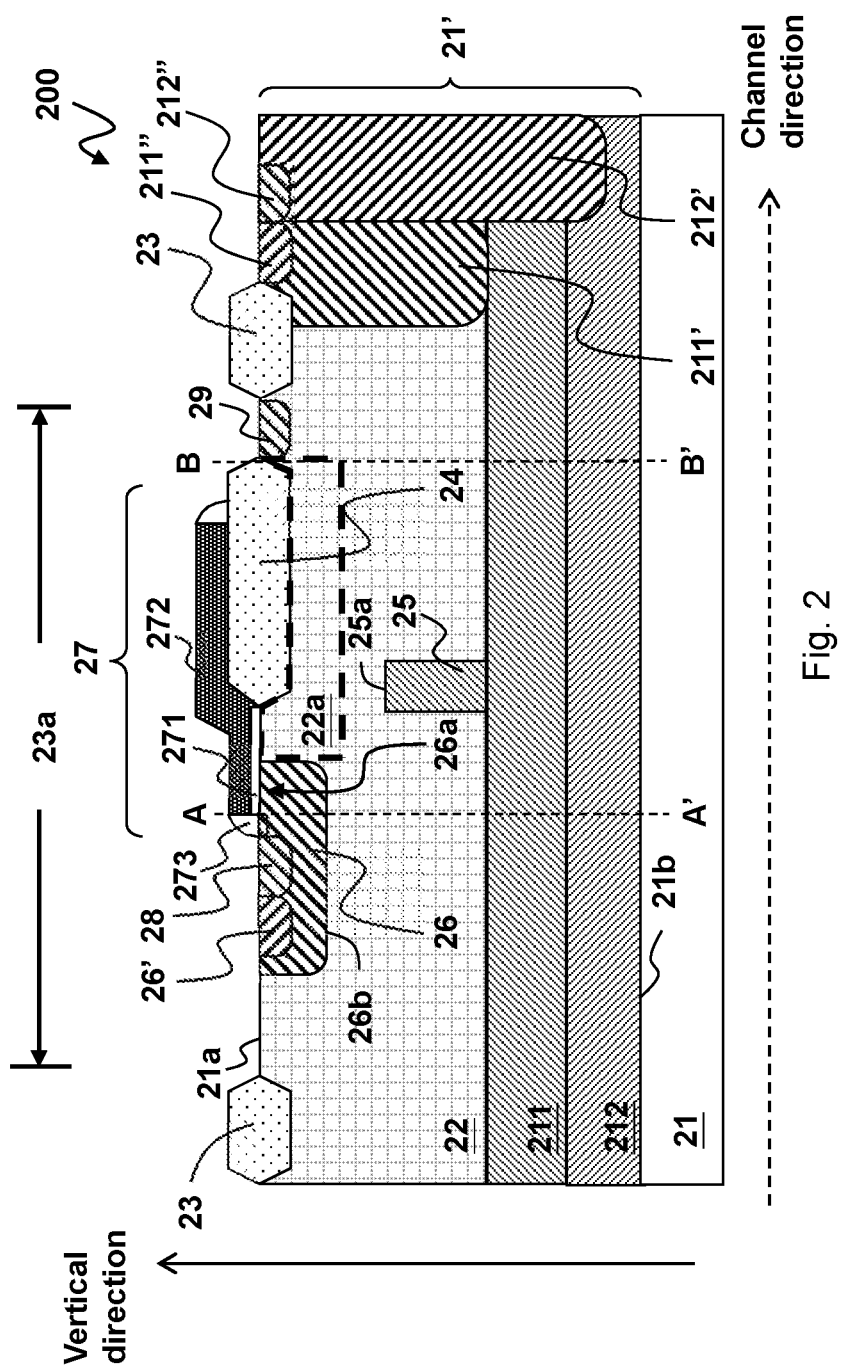
FIG. 2 shows a first embodiment of the present invention.

Please refer to FIG. 2 which shows a first embodiment of the present invention. FIG. 2 shows a schematic of a cross-section view of a high voltage device 200. As shown in FIG. 2, the high voltage device 200 includes a semiconductor layer 21', a deep well 211, a buried layer 212, a first high voltage well 22, an isolation structure 23, a drift oxide region 24, a deep well column 25, a body region 26, a body contact 26', a gate 27, a source 28, a drain 29, a first conductivity type well 211', a first conductivity type contact 211'', a second high voltage well 212', and a second conductivity type contact 212''.

The semiconductor layer 21' is formed on the substrate 21, and the semiconductor layer 21' has a top surface 21a and a bottom surface 21b that is opposite to the top surface 21a in a vertical direction (as indicated by the direction of the solid arrow in FIG. 2). The substrate 21 is, for example but not limited to, a P-type or N-type silicon substrate. The semiconductor layer 21', for example, is formed on the substrate 21 by an epitaxial growth process step, or, a part of the substrate 21 is used as the semiconductor layer 21'. The semiconductor layer 21' can be formed by any method known to a person having ordinary skill in the art, so the details thereof are not redundantly explained here.

Still referring to FIG. 2, the isolation structure 23 is formed on the top surface 21a and in contact with the top surface 21a, for defining an device region 23a. The isolation structure 23 is not limited to the local oxidation of silicon (LOCOS) structure as shown in the figure; for example, it may be a shallow trench isolation (STI) structure instead. The device region 23a is an active region of the operation of the high voltage device 200. The drift oxide region 24 is formed on the top surface 21a and in contact with the top surface 21a, and the drift oxide region 24 is located on the drift region 22a (as indicated by the dashed frame shown in FIG. 2) within the device region 23a, and is in contact with the drift region 22a. In this embodiment, the drift oxide region 24 includes a local oxidation of silicon (LOCOS) structure as shown in the figure; in other embodiments, the drift oxide region 24 can include a shallow trench isolation (STI) structure, or a chemical vapor deposition (CVD) structure.

The deep well 211 is formed in the semiconductor layer 21', and has a first conductivity type. The deep well 211 can be formed by, for example but not limited to, an ion implantation process step which implants first conductivity type impurities into the semiconductor layer 21' in the form of accelerated ions, to form the deep well 211. The buried layer 212 is formed below the deep well 211 in the semiconductor layer 21', and has a second conductivity type. The buried layer 212 encompasses the lower boundary of the deep well 211, and is in contact with the deep well 211. The buried layer 212 can be formed by, for example but not limited to, anion implantation process step which implants second conductivity type impurities into the substrate 21 and/or the semiconductor layer 21' in the form of accelerated ions, to form the buried layer 212. For example, when the semiconductor layer 21' is an epitaxial layer formed on the substrate 21, the second conductivity type impurities are implanted into the substrate 21 in the form of accelerated ions, and thereafter the epitaxial layer is formed on the substrate 21 by an epitaxial growth process step to form the semiconductor layer 21', and then the buried layer 212 is formed at or around an interface between the substrate 21 and the semiconductor layer 21' by a thermal process step, wherein part of the second conductivity type impurities diffuse from the substrate 21 to the semiconductor layer 21' in the thermal process step to form the buried layer 212.

Still referring to FIG. 2, the first high voltage well 22 is formed on the deep well 211 in the semiconductor layer 21', and has the second conductivity type. The first high voltage well 22 overlays an upper boundary of the deep well 211 and is in contact with the deep well 211, and the first high voltage well 22 is below and in contact with the top surface 21a in the vertical direction. The first conductivity type well 211' is formed in the first high voltage well 22 outside the device region 23a, and has the first conductivity type. The first conductivity type well 211' is located below the top surface 21a and in contact with the top surface 21a in the vertical direction. The first conductivity type well 211' is in contact with the deep well 211 and is electrically connected to the deep well 211. The second high voltage well 212' is formed in the first high voltage well 22 outside the device region 23a, and has the second conductivity type. The second high voltage well 212' is located below the top surface 21a and in contact with the top surface 21a in the vertical direction. The second high voltage well 212' is in contact with the buried layer 212, and is electrically connected to the buried layer 212.

The first conductivity type contact 211'' is formed in the first conductivity type well 211', and has the first conductivity type. The first conductivity type contact 211'' is located below the top surface 21a and in contact with the top surface 21a in the vertical direction, to serve as an electrical contact of the first conductivity type well 211'. The second conductivity type contact 212'' is formed in the second conductivity type well 212', and has the second conductivity type. The second conductivity type contact 212'' is located below the top surface 21a and in contact with the top surface 21a in the vertical direction, to serve as an electrical contact of the second conductivity type well 212'.

The body region 26 is formed in the first high voltage well 22 within the device region 23a, and has the first conductivity type. The body region 26 is located below the top surface 21a and in contact with the top surface 21a in the vertical direction. The body contact 26' is formed in the body region 26, and has the first conductivity type. The body contact 26' is located below the top surface 21a and in contact with the top surface 21a in the vertical direction, to serve as an electrical contact of the body region 26. The deep well column 25 is formed in the first high voltage well 22 within the device region 23a, and has the first conductivity type. The deep well column 25 is in contact with the deep well 211, and is electrically connected to the deep well 211, but is not in contact with the top surface 21a in the vertical direction.

The gate 27 is formed on the top surface 21a within the device region 23a, wherein part of the first high voltage well 22 is located below and in contact with the gate 27 in the vertical direction. The gate 27 at least includes: a dielectric layer 271, a conductive layer 272, and a spacer layer 273. The dielectric layer 271 is formed on the top surface 21a and in contact with the top surface 21a, and is in contact with the first high voltage well 22 in the vertical direction. The conductive layer 272 is formed on the dielectric layer 271 and in contact with the dielectric layer 271, to serve as an electrical contact of the gate 27. The spacer layer 273 is formed outside of two sidewalls of the conductive layer 272, to serve as an electrical insulation layer of the gate 27.

The source 28 and the drain 29 have the second conductivity type. The source 28 and the drain 29 are formed below the top surface 21a and in contact with the top surface 21a in the vertical direction within the device region 23a. The source 28 and the drain 29 are located below and outside two sides of the gate 27 respectively, wherein the source 28 is located in the body region 26, and the drain 29 is located in the first high voltage well 22, at a location near the right side of the gate 27 (i.e., the side that is away from the body region 26). An inversion region 26a is formed in the body region 26 between the source 28 and the first high voltage well 22 in a channel direction (indicated by a dashed arrow), and is in contact with the top surface 21a, to serve as an inversion current channel in an ON operation of the high voltage device 200. A drift region 22a is formed in the first high voltage well 22 between the drain 29 and the body region 26 in the channel direction, and is in contact with the top surface 21a, to serve as a drift current channel in the ON operation of the high voltage device 200. The deep well column 25 is located between the drain 29 and the left boundary of the conductive layer 272 (i.e., the boundary of the conductive layer 272 which is near the source 28) in the channel direction, i.e., between the vertical lines AA' and BB' shown in the figure.

Note that, in a preferable embodiment, an upper boundary 25a of the deep well column 25 is deeper than a lower boundary 26b of the body region 26 in the vertical direction. That is, all the deep well column 25 is locate below all the body region 26, and the deep well column 25 is not higher than any part of the body region 26.

Note that the term "inversion current channel" means thus. Taking this embodiment as an example, when the high voltage device 200 operates in ON operation due to the voltage applied to the gate 27, an inversion layer is formed beneath the gate 27, between the source 28 and the drift current channel, so that a conduction current flows through the region of the inversion layer, which is the inverse current channel known to a person having ordinary skill in the art.

Note that the term "drift current channel" means thus. Taking this embodiment as an example, the drift current channel refers to a region where the conduction current passes through in a drifting manner when the high-voltage device 200 operates in ON operation, which is known to a person having ordinary skill in the art.

Note that the top surface 21a as referred to does not mean a completely flat plane but refers to the surface of the semiconductor layer 21'. In the present embodiment, for example, a part of the top surface 21a where the drift oxide region 24 is in contact with has a recessed portion.

Note that the gate 27 includes a dielectric layer 271 in contact with the top surface 21a, a conductive layer 272 on the dielectric layer 271, and a spacer layer 273 having electrical insulation properties, which is known to a person having ordinary skill in the art, so the details thereof are not redundantly explained here.

Note that the above-mentioned "first conductivity type" and "second conductivity type" mean that impurities of corresponding conductivity types are doped in regions of the high voltage MOS device (for example but not limited to the aforementioned well region, body region, source and drain, etc.), so that the regions have the corresponding conductivity types. For example the first conductivity type is N-type and the second conductivity type is P-type, or the first conductivity type is P-type and the second conductivity type is N-type.

In addition, the term "high voltage MOS device" refers to a transistor device wherein a voltage applied to the drain thereof in normal operation is higher than a specific voltage, such as 5V. A lateral distance (length of the drift region) between the body region 26 and the drain 29 of the high voltage device 200 is determined according to the required operation voltage during normal operation, so that the device can operate at or higher than the aforementioned specific voltage, which is known to a person having ordinary skill in the art, so the details thereof are not redundantly explained here.

One technical feature of the present invention which is advantageous over the prior art is that, according to the present invention, taking the embodiment shown in FIG. 2 as an example, when the high voltage device 200 operates, minority carriers of the hot carriers caused by high electric field (for example but not limited to holes in an N-type high voltage device) are absorbed by a minority carriers absorption channel which is provided by the deep well column 25, to avoid turning ON a parasitic transistor formed by the source 28, the body region 26, and the first high voltage well 22 turning ON. The current which may be formed by the minority carriers in the prior art is suppressed by the effect of the minority carriers absorption channel provided by the deep well column 25, and therefore the safe operation area (SOA) is increased to improve the performance of the high voltage device 200 is improved.

Figure 3:
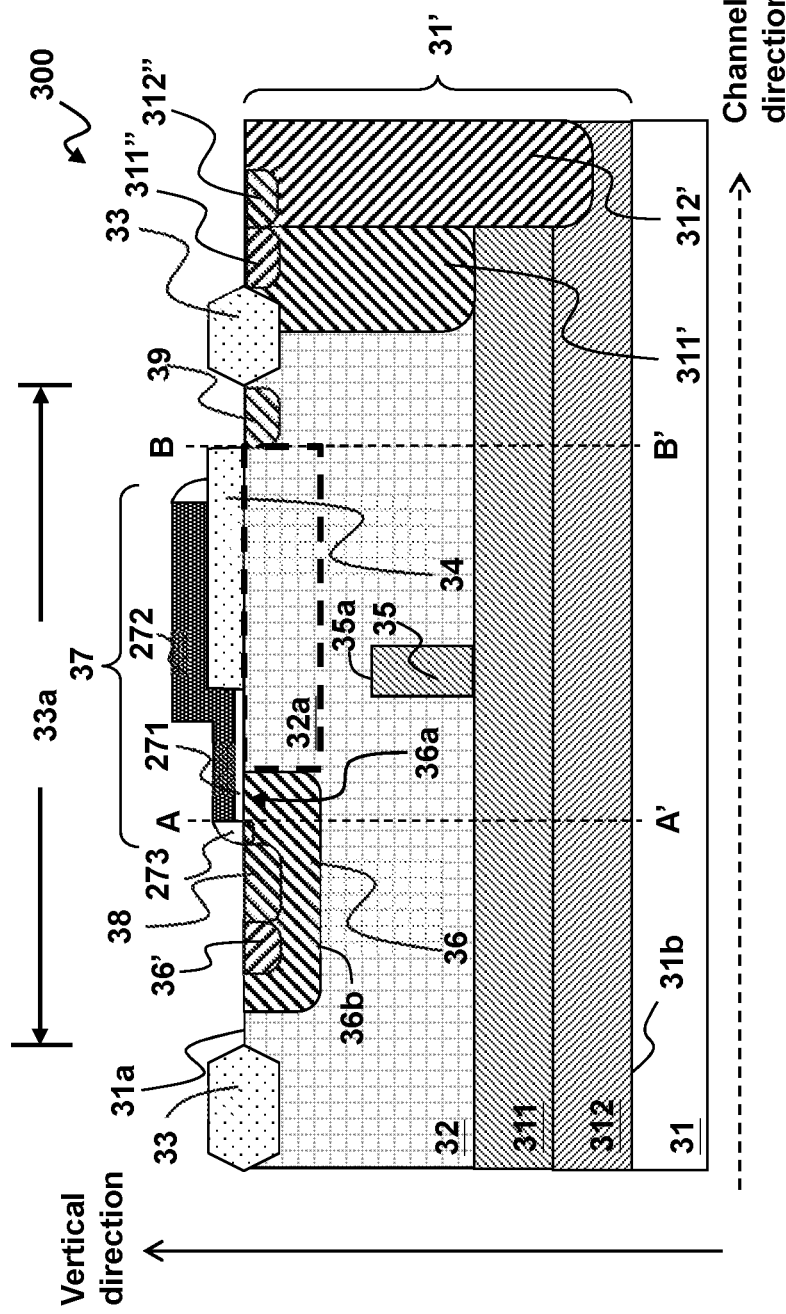
FIG. 3 shows a second embodiment of the present invention.

Please refer to FIG. 3 which shows a second embodiment of the present invention. FIG. 3 shows a schematic of a cross-section view of a high voltage device 300. As shown in FIG. 3, the high voltage device 300 includes a semiconductor layer 31', a deep well 311, a buried layer 312, a first high voltage well 32, an isolation structure 33, a drift oxide region 34, a deep well column 35, a body region 36, a body contact 36', a gate 37, a source 38, a drain 39, a first conductivity type well 311', a first conductivity type contact 311'', a second high voltage well 312', and a second conductivity type contact 312''.

The semiconductor layer 31' is formed on the substrate 31, and the semiconductor layer 31' has a top surface 31a and a bottom surface 31b that is opposite to the top surface 31a in a vertical direction (as indicated by the direction of the solid arrow in FIG. 3). The substrate 31 is, for example but not limited to, a P-type or N-type silicon substrate. The semiconductor layer 31', for example, is formed on the substrate 31 by an epitaxial growth process step, or, a part of the substrate 31 is used as the semiconductor layer 31'. The semiconductor layer 31' can be formed by any method known to a person having ordinary skill in the art, so the details thereof are not redundantly explained here.

Still referring to FIG. 3, the isolation structure 33 is formed on the top surface 31a and in contact with the top surface 31a, for defining an device region 33a. The isolation structure 33 is not limited to the local oxidation of silicon (LOCOS) structure as shown in the figure; for example, it may be a shallow trench isolation (STI) structure instead. The device region 33a is an active region of the operation of the high voltage device 300. The drift oxide region 34 is formed on the top surface 31a and in contact with the top surface 31a, and the drift oxide region 34 is located on the drift region 32a (as indicated by the dashed frame shown in FIG. 3) within the device region 33a, and is in contact with the drift region 32a.

The deep well 311 is formed in the semiconductor layer 31', and has a first conductivity type. The deep well 311 can be formed by, for example but not limited to, an ion implantation process step which implants first conductivity type impurities into the semiconductor layer 31' in the form of accelerated ions, to form the deep well 311. The buried layer 312 is formed below the deep well 311 in the semiconductor layer 31', and has a second conductivity type. The buried layer 312 encompasses the lower boundary of the deep well 311, and is in contact with the deep well 311. The buried layer 312 can be formed by, for example but not limited to, anion implantation process step which implants second conductivity type impurities into the substrate 31 and/or the semiconductor layer 31' in the form of accelerated ions, to form the buried layer 312. For example, when the semiconductor layer 31' is an epitaxial layer formed on the substrate 31, the second conductivity type impurities are implanted into the substrate 31 in the form of accelerated ions, and thereafter the epitaxial layer is formed on the substrate 31 by an epitaxial growth process step to form the semiconductor layer 31', and then the buried layer 312 is formed at or around an interface between the substrate 31 and the semiconductor layer 31' by a thermal process step, wherein part of the second conductivity type impurities diffuse from the substrate 31 to the semiconductor layer 31' in the thermal process step to form the buried layer 312.

Still referring to FIG. 3, the first high voltage well 32 is formed on the deep well 311 in the semiconductor layer 31', and has the second conductivity type. The first high voltage well 32 overlays an upper boundary of the deep well 311 and is in contact with the deep well 311, and the first high voltage well 32 is below and in contact with the top surface 31a in the vertical direction. The first conductivity type well 311' is formed in the first high voltage well 32 outside the device region 33a, and has the first conductivity type. The first conductivity type well 311' is located below the top surface 31a and in contact with the top surface 31a in the vertical direction. The first conductivity type well 311' is in contact with the deep well 311 and is electrically connected to the deep well 311. The second high voltage well 312' is formed in the first high voltage well 32 outside the device region 33a, and has the second conductivity type. The second high voltage well 312' is located below the top surface 31a and in contact with the top surface 31a in the vertical direction. The second high voltage well 312' is in contact with the buried layer 312, and is electrically connected to the buried layer 312.

The first conductivity type contact 311" is formed in the first conductivity type well 311', and has the first conductivity type. The first conductivity type contact 311" is located below the top surface 31a and in contact with the top surface 31a in the vertical direction, to serve as an electrical contact of the first conductivity type well 311'. The second conductivity type contact 312" is formed in the second conductivity type well 312', and has the second conductivity type. The second conductivity type contact 312" is located below the top surface 31a and in contact with the top surface 31a in the vertical direction, to serve as an electrical contact of the second conductivity type well 312'.

The body region 36 is formed in the first high voltage well 32 within the device region 33a, and has the first conductivity type. The body region 36 is located below the top surface 31a and in contact with the top surface 31a in the vertical direction. The body contact 36' is formed in the body region 36, and has the first conductivity type. The body contact 36' is located below the top surface 31a and in contact with the top surface 31a in the vertical direction, to serve as an electrical contact of the body region 36. The deep well column 35 is formed in the first high voltage well 32 within the device region 33a, and has the first conductivity type. The deep well column 35 is in contact with the deep well 311, and is electrically connected to the deep well 311, but is not in contact with the top surface 31a in the vertical direction.

The gate 37 is formed on the top surface 31a within the device region 33a, wherein part of the first high voltage well 32 is located below and in contact with the gate 37 in the vertical direction. The gate 37 at least includes: a dielectric layer 371, a conductive layer 372, and a spacer layer 373. The dielectric layer 371 is formed on the top surface 31a and in contact with the top surface 31a, and is in contact with the first high voltage well 32 in the vertical direction. The conductive layer 372 is formed on the dielectric layer 371 and in contact with the dielectric layer 371, to serve as an electrical contact of the gate 37. The spacer layer 373 is formed outside of two sidewalls of the conductive layer 372, to serve as an electrical insulation layer of the gate 37.

The source 38 and the drain 39 have the second conductivity type. The source 38 and the drain 39 are formed below the top surface 31a and in contact with the top surface 31a in the vertical direction within the device region 33a. The source 38 and the drain 39 are located below and outside two sides of the gate 37 respectively, wherein the source 38 is located in the body region 36, and the drain 39 is located in the first high voltage well 32, at a location near the right side of the gate 37 (i.e., the side that is away from the body region 36). An inversion region 36a is formed in the body region 36 between the source 38 and the first high voltage well 32 in a channel direction (indicated by a dashed arrow), and is in contact with the top surface 31a, to serve as an inversion current channel in an ON operation of the high voltage device 300. A drift region 32a is formed in the first high voltage well 32 between the drain 39 and the body region 36 in the channel direction, and is in contact with the top surface 31a, to serve as a drift current channel in the ON operation of the high voltage device 300. The deep well column 35 is located between the drain 39 and the left boundary of the conductive layer 372 (i.e., the boundary of the conductive layer 372 which is near the source 38) in the channel direction, i.e., between the vertical lines AA' and BB' shown in the figure.

This embodiment differs from the first embodiment in that, in the first embodiment, the drift oxide region 24 is a LOCOS structure, while in this embodiment, the drift oxide region 34 is a chemical vapor deposition (chemical vapor deposition, CVD) oxide region. The CVD oxide region is formed by a CVD process deposition step. CVD deposition is well known to a person having ordinary skill in the art, so the details thereof are not redundantly explained here.

Figure 4:
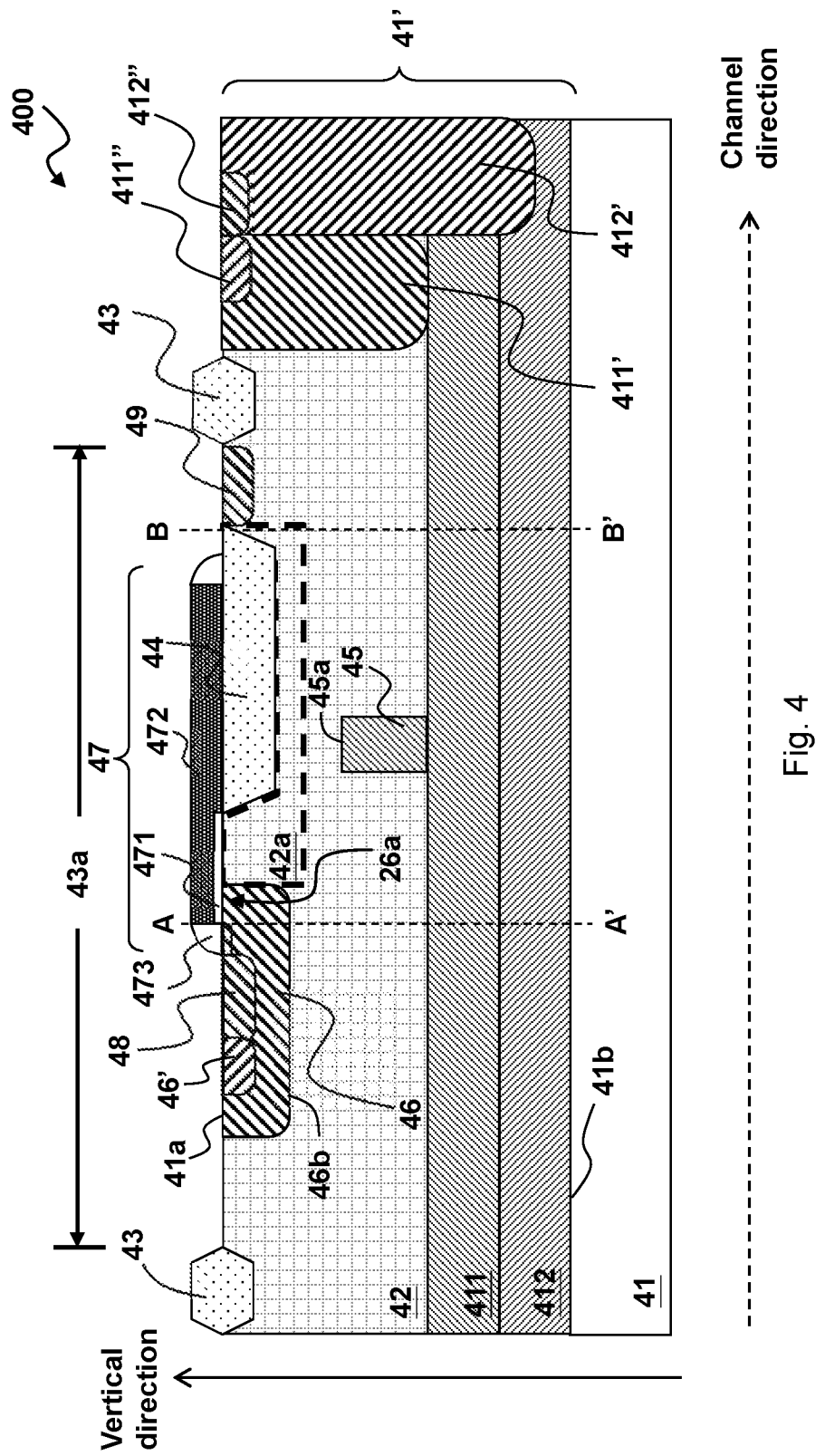
FIG. 4 shows a third embodiment of the present invention.

Please refer to FIG. 4 which shows a third embodiment of the present invention. FIG. 4 shows a schematic of a cross-section view of a high voltage device 400. As shown in FIG. 4, the high voltage device 400 includes a semiconductor layer 41', a deep well 411, a buried layer 412, a first high voltage well 42, an isolation structure 43, a drift oxide region 44, a deep well column 45, a body region 46, a body contact 46', a gate 47, a source 48, a drain 49, a first conductivity type well 411', a first conductivity type contact 411", a second high voltage well 412', and a second conductivity type contact 412".

The semiconductor layer 41' is formed on the substrate 41, and the semiconductor layer 41' has a top surface 41a and a bottom surface 41b that is opposite to the top surface 41a in a vertical direction (as indicated by the direction of the solid arrow in FIG. 4). The substrate 41 is, for example but not limited to, a P-type or N-type silicon substrate. The semiconductor layer 41', for example, is formed on the substrate 41 by an epitaxial growth process step, or, a part of the substrate 41 is used as the semiconductor layer 41'. The semiconductor layer 41' can be formed by any method known to a person having ordinary skill in the art, so the details thereof are not redundantly explained here.

Still referring to FIG. 4, the isolation structure 43 is formed on the top surface 41a and in contact with the top surface 41a, for defining an device region 43a. The isolation structure 43 is not limited to the local oxidation of silicon (LOCOS) structure as shown in the figure; for example, it may be a shallow trench isolation (STI) structure instead. The device region 43a is an active region of the operation of the high voltage device 400. The drift oxide region 44 is formed on the top surface 41*a* and in contact with the top surface 41*a*, and the drift oxide region 44 is located on the drift region 42*a* (as indicated by the dashed frame shown in FIG. 4) within the device region 43*a*, and is in contact with the drift region 42*a*.

The deep well 411 is formed in the semiconductor layer 41', and has a first conductivity type. The deep well 411 can be formed by, for example but not limited to, an ion implantation process step which implants first conductivity type impurities into the semiconductor layer 41' in the form of accelerated ions, to form the deep well 411. The buried layer 412 is formed below the deep well 411 in the semiconductor layer 41', and has a second conductivity type. The buried layer 412 encompasses the lower boundary of the deep well 411, and is in contact with the deep well 411. The buried layer 412 can be formed by, for example but not limited to, anion implantation process step which implants second conductivity type impurities into the substrate 41 and/or the semiconductor layer 41' in the form of accelerated ions, to form the buried layer 412. For example, when the semiconductor layer 41' is an epitaxial layer formed on the substrate 41, the second conductivity type impurities are implanted into the substrate 41 in the form of accelerated ions, and thereafter the epitaxial layer is formed on the substrate 41 by an epitaxial growth process step to form the semiconductor layer 41', and then the buried layer 412 is formed at or around an interface between the substrate 41 and the semiconductor layer 41' by a thermal process step, wherein part of the second conductivity type impurities diffuse from the substrate 41 to the semiconductor layer 41' in the thermal process step to form the buried layer 412.

Still referring to FIG. 4, the first high voltage well 42 is formed on the deep well 411 in the semiconductor layer 41', and has the second conductivity type. The first high voltage well 42 overlays an upper boundary of the deep well 411 and is in contact with the deep well 411, and the first high voltage well 42 is below and in contact with the top surface 41*a* in the vertical direction. The first conductivity type well 411' is formed in the first high voltage well 42 outside the device region 43*a*, and has the first conductivity type. The first conductivity type well 411' is located below the top surface 41*a* and in contact with the top surface 41*a* in the vertical direction. The first conductivity type well 411' is in contact with the deep well 411 and is electrically connected to the deep well 411. The second high voltage well 412' is formed in the first high voltage well 42 outside the device region 43*a*, and has the second conductivity type. The second high voltage well 412' is located below the top surface 41*a* and in contact with the top surface 41*a* in the vertical direction. The second high voltage well 412' is in contact with the buried layer 412, and is electrically connected to the buried layer 412.

The first conductivity type contact 411" is formed in the first conductivity type well 411', and has the first conductivity type. The first conductivity type contact 411" is located below the top surface 41*a* and in contact with the top surface 41*a* in the vertical direction, to serve as an electrical contact of the first conductivity type well 411'. The second conductivity type contact 412" is formed in the second conductivity type well 412', and has the second conductivity type. The second conductivity type contact 412" is located below the top surface 41*a* and in contact with the top surface 41*a* in the vertical direction, to serve as an electrical contact of the second conductivity type well 412'.

The body region 46 is formed in the first high voltage well 42 within the device region 43*a*, and has the first conductivity type. The body region 46 is located below the top surface 41*a* and in contact with the top surface 41*a* in the vertical direction. The body contact 46' is formed in the body region 46, and has the first conductivity type. The body contact 46' is located below the top surface 41*a* and in contact with the top surface 41*a* in the vertical direction, to serve as an electrical contact of the body region 46. The deep well column 45 is formed in the first high voltage well 42 within the device region 43*a*, and has the first conductivity type. The deep well column 45 is in contact with the deep well 411, and is electrically connected to the deep well 411, but is not in contact with the top surface 41*a* in the vertical direction.

The gate 47 is formed on the top surface 41*a* within the device region 43*a*, wherein part of the first high voltage well 42 is located below and in contact with the gate 47 in the vertical direction. The gate 47 at least includes: a dielectric layer 471, a conductive layer 472, and a spacer layer 473. The dielectric layer 471 is formed on the top surface 41*a* and in contact with the top surface 41*a*, and is in contact with the first high voltage well 42 in the vertical direction. The conductive layer 472 is formed on the dielectric layer 471 and in contact with the dielectric layer 471, to serve as an electrical contact of the gate 47. The spacer layer 473 is formed outside of two sidewalls of the conductive layer 472, to serve as an electrical insulation layer of the gate 47.

The source 48 and the drain 49 have the second conductivity type. The source 48 and the drain 49 are formed below the top surface 41*a* and in contact with the top surface 41*a* in the vertical direction within the device region 43*a*. The source 48 and the drain 49 are located below and outside two sides of the gate 47 respectively, wherein the source 48 is located in the body region 46, and the drain 49 is located in the first high voltage well 42, at a location near the right side of the gate 47 (i.e., the side that is away from the body region 46). An inversion region 46*a* is formed in the body region 46 between the source 48 and the first high voltage well 42 in a channel direction (indicated by a dashed arrow), and is in contact with the top surface 41*a*, to serve as an inversion current channel in an ON operation of the high voltage device 400. A drift region 42*a* is formed in the first high voltage well 42 between the drain 49 and the body region 46 in the channel direction, and is in contact with the top surface 41*a*, to serve as a drift current channel in the ON operation of the high voltage device 400. The deep well column 45 is located between the drain 49 and the left boundary of the conductive layer 472 (i.e., the boundary of the conductive layer 472 which is near the source 48) in the channel direction, i.e., between the vertical lines AA' and BB' shown in the figure.

This embodiment differs from the first embodiment in that, in the first embodiment, the drift oxide region 24 is a LOCOS structure, while in this embodiment, the drift oxide region 34 is a shallow trench isolation (STI) structure. The STI structure is well known to a person having ordinary skill in the art, so the details thereof are not redundantly explained here.

Figure 5:
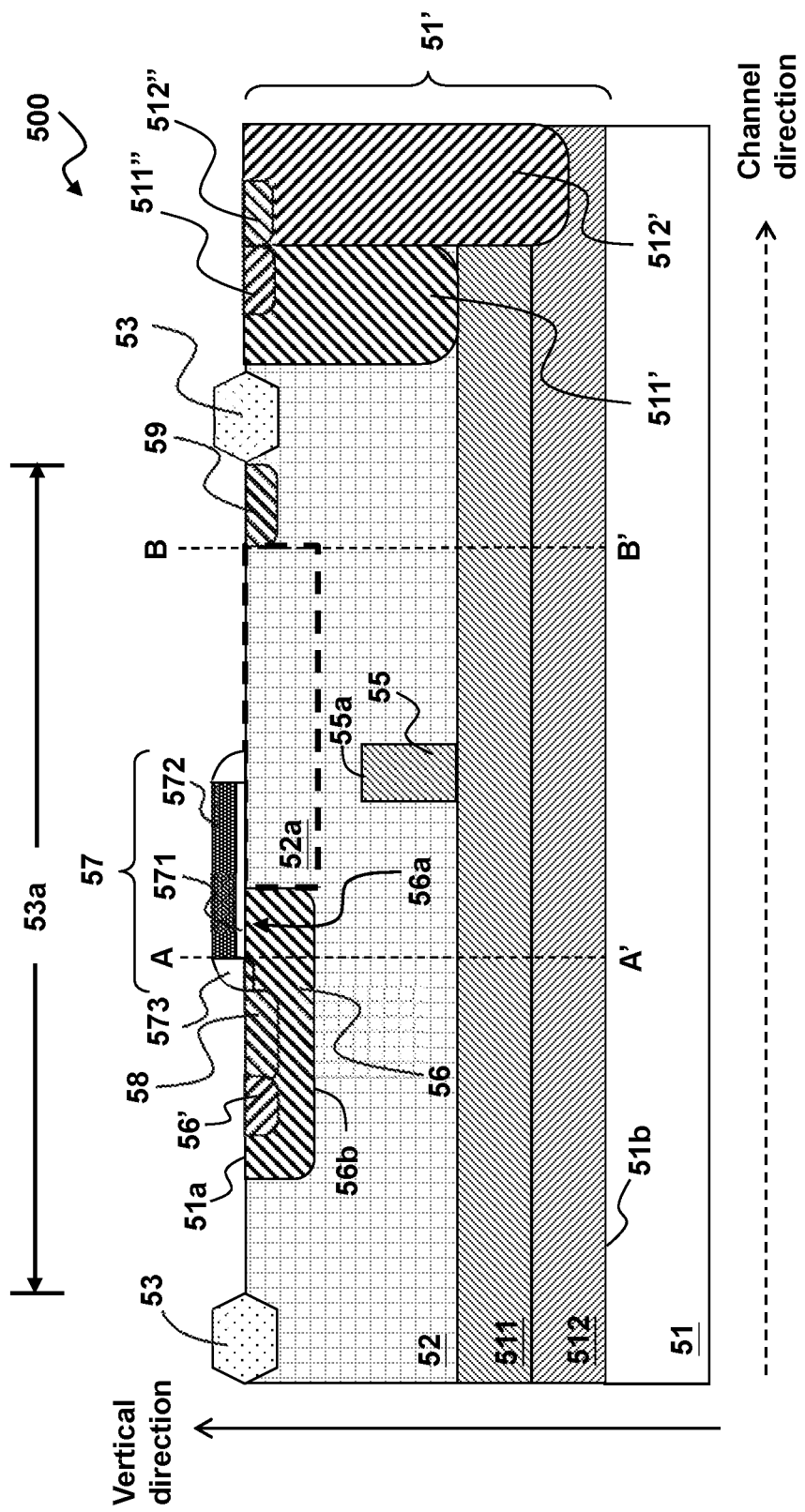
FIG. 5 shows a fourth embodiment of the present invention.

Please refer to FIG. 5 which shows a fourth embodiment of the present invention. FIG. 5 shows a schematic of a cross-section view of a high voltage device 500. As shown in FIG. 5, the high voltage device 500 includes a semiconductor layer 51', a deep well 511, a buried layer 512, a first high voltage well 52, an isolation structure 53, a deep well column 55, a body region 56, a body contact 56', a gate 57, a source 58, a drain 59, a first conductivity type well 511', a first conductivity type contact 511", a second high voltage well 512', and a second conductivity type contact 512".

The semiconductor layer 51' is formed on the substrate 51, and the semiconductor layer 51' has a top surface 51a and a bottom surface 51b that is opposite to the top surface 51a in a vertical direction (as indicated by the direction of the solid arrow in FIG. 5). The substrate 51 is, for example but not limited to, a P-type or N-type silicon substrate. The semiconductor layer 51', for example, is formed on the substrate 51 by an epitaxial growth process step, or, a part of the substrate 51 is used as the semiconductor layer 51'. The semiconductor layer 51' can be formed by any method known to a person having ordinary skill in the art, so the details thereof are not redundantly explained here.

Still referring to FIG. 5, the isolation structure 53 is formed on the top surface 51a and in contact with the top surface 51a, for defining an device region 53a. The isolation structure 53 is not limited to the local oxidation of silicon (LOCOS) structure as shown in the figure; for example, it may be a shallow trench isolation (STI) structure instead. The device region 53a is an active region of the operation of the high voltage device 500.

The deep well 511 is formed in the semiconductor layer 51', and has a first conductivity type. The deep well 511 can be formed by, for example but not limited to, an ion implantation process step which implants first conductivity type impurities into the semiconductor layer 51' in the form of accelerated ions, to form the deep well 511. The buried layer 512 is formed below the deep well 511 in the semiconductor layer 51', and has a second conductivity type. The buried layer 512 encompasses the lower boundary of the deep well 511, and is in contact with the deep well 511. The buried layer 512 can be formed by, for example but not limited to, anion implantation process step which implants second conductivity type impurities into the substrate 51 and/or the semiconductor layer 51' in the form of accelerated ions, to form the buried layer 512. For example, when the semiconductor layer 51' is an epitaxial layer formed on the substrate 51, the second conductivity type impurities are implanted into the substrate 51 in the form of accelerated ions, and thereafter the epitaxial layer is formed on the substrate 51 by an epitaxial growth process step to form the semiconductor layer 51', and then the buried layer 512 is formed at or around an interface between the substrate 51 and the semiconductor layer 51' by a thermal process step, wherein part of the second conductivity type impurities diffuse from the substrate 51 to the semiconductor layer 51' in the thermal process step to form the buried layer 512.

Still referring to FIG. 5, the first high voltage well 52 is formed on the deep well 511 in the semiconductor layer 51', and has the second conductivity type. The first high voltage well 52 overlays an upper boundary of the deep well 511 and is in contact with the deep well 511, and the first high voltage well 52 is below and in contact with the top surface 51a in the vertical direction. The first conductivity type well 511' is formed in the first high voltage well 52 outside the device region 53a, and has the first conductivity type. The first conductivity type well 511' is located below the top surface 51a and in contact with the top surface 51a in the vertical direction. The first conductivity type well 511' is in contact with the deep well 511 and is electrically connected to the deep well 511. The second high voltage well 512' is formed in the first high voltage well 52 outside the device region 53a, and has the second conductivity type. The second high voltage well 512' is located below the top surface 51a and in contact with the top surface 51a in the vertical direction. The second high voltage well 512' is in contact with the buried layer 512, and is electrically connected to the buried layer 512.

The first conductivity type contact 511" is formed in the first conductivity type well 511', and has the first conductivity type. The first conductivity type contact 511" is located below the top surface 51a and in contact with the top surface 51a in the vertical direction, to serve as an electrical contact of the first conductivity type well 511'. The second conductivity type contact 512" is formed in the second conductivity type well 512', and has the second conductivity type. The second conductivity type contact 512" is located below the top surface 51a and in contact with the top surface 51a in the vertical direction, to serve as an electrical contact of the second conductivity type well 512'.

The body region 56 is formed in the first high voltage well 52 within the device region 53a, and has the first conductivity type. The body region 56 is located below the top surface 51a and in contact with the top surface 51a in the vertical direction. The body contact 56' is formed in the body region 56, and has the first conductivity type. The body contact 56' is located below the top surface 51a and in contact with the top surface 51a in the vertical direction, to serve as an electrical contact of the body region 56. The deep well column 55 is formed in the first high voltage well 52 within the device region 53a, and has the first conductivity type. The deep well column 55 is in contact with the deep well 511, and is electrically connected to the deep well 511, but is not in contact with the top surface 51a in the vertical direction.

The gate 57 is formed on the top surface 51a within the device region 53a, wherein part of the first high voltage well 52 is located below and in contact with the gate 57 in the vertical direction. The gate 57 at least includes: a dielectric layer 571, a conductive layer 572, and a spacer layer 573. The dielectric layer 571 is formed on the top surface 51a and in contact with the top surface 51a, and is in contact with the first high voltage well 52 in the vertical direction. The conductive layer 572 is formed on the dielectric layer 571 and in contact with the dielectric layer 571, to serve as an electrical contact of the gate 57. The spacer layer 573 is formed outside of two sidewalls of the conductive layer 572, to serve as an electrical insulation layer of the gate 57.

The source 58 and the drain 59 have the second conductivity type. The source 58 and the drain 59 are formed below the top surface 51a and in contact with the top surface 51a in the vertical direction within the device region 53a. The source 58 and the drain 59 are located below and outside two sides of the gate 57 respectively, wherein the source 58 is located in the body region 56, and the drain 59 is located in the first high voltage well 52, at a location near the right side of the gate 57 (i.e., the side that is away from the body region 56). An inversion region 56a is formed in the body region 56 between the source 58 and the first high voltage well 52 in a channel direction (indicated by a dashed arrow), and is in contact with the top surface 51a, to serve as an inversion current channel in an ON operation of the high voltage device 500. A drift region 52a is formed in the first high voltage well 52 between the drain 59 and the body region 56 in the channel direction, and is in contact with the top surface 51a, to serve as a drift current channel in the ON operation of the high voltage device 500. The deep well column 55 is located between the drain 59 and the left boundary of the conductive layer 572 (i.e., the boundary of the conductive layer 572 which is near the source 58) in the channel direction, i.e., between the vertical lines AA' and BB' shown in the figure.

This embodiment differs from the first embodiment in that, in the first embodiment, the drift oxide region 24 is a LOCOS structure, while in this embodiment, the high voltage device 500 does not include any drift oxide region on the drift region 52*a*. The lateral distance (length of the drift region 52*a*) between the body region 56 and the drain 59 of the high voltage device 500 is determined according to the operation voltage that the device is required to operate with.

Figure 6A:
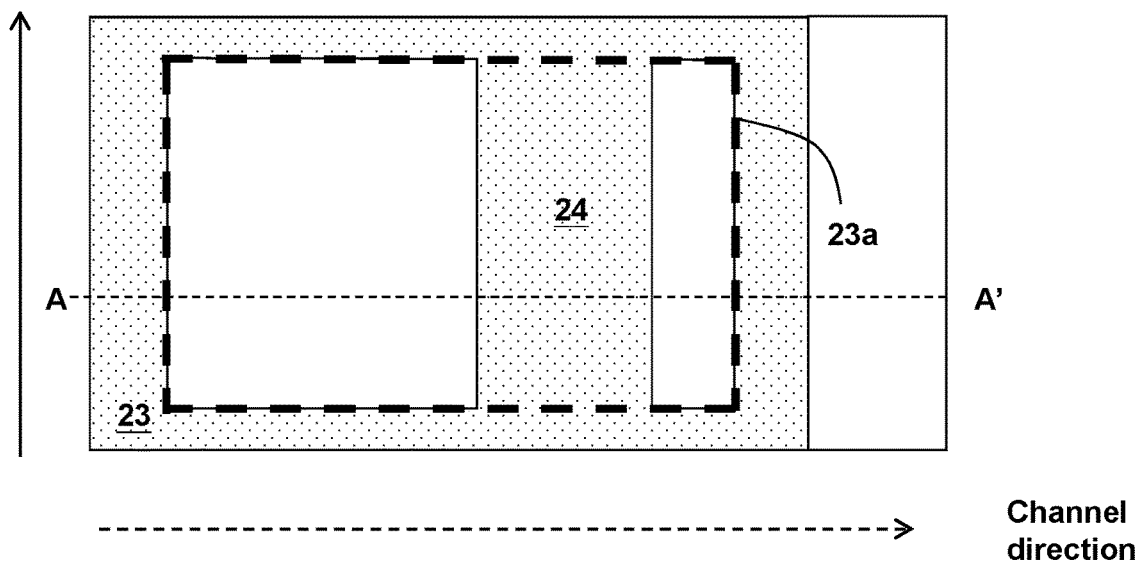
FIGS. 6A-6G show a fifth embodiment of the present invention.
Figure 6B:
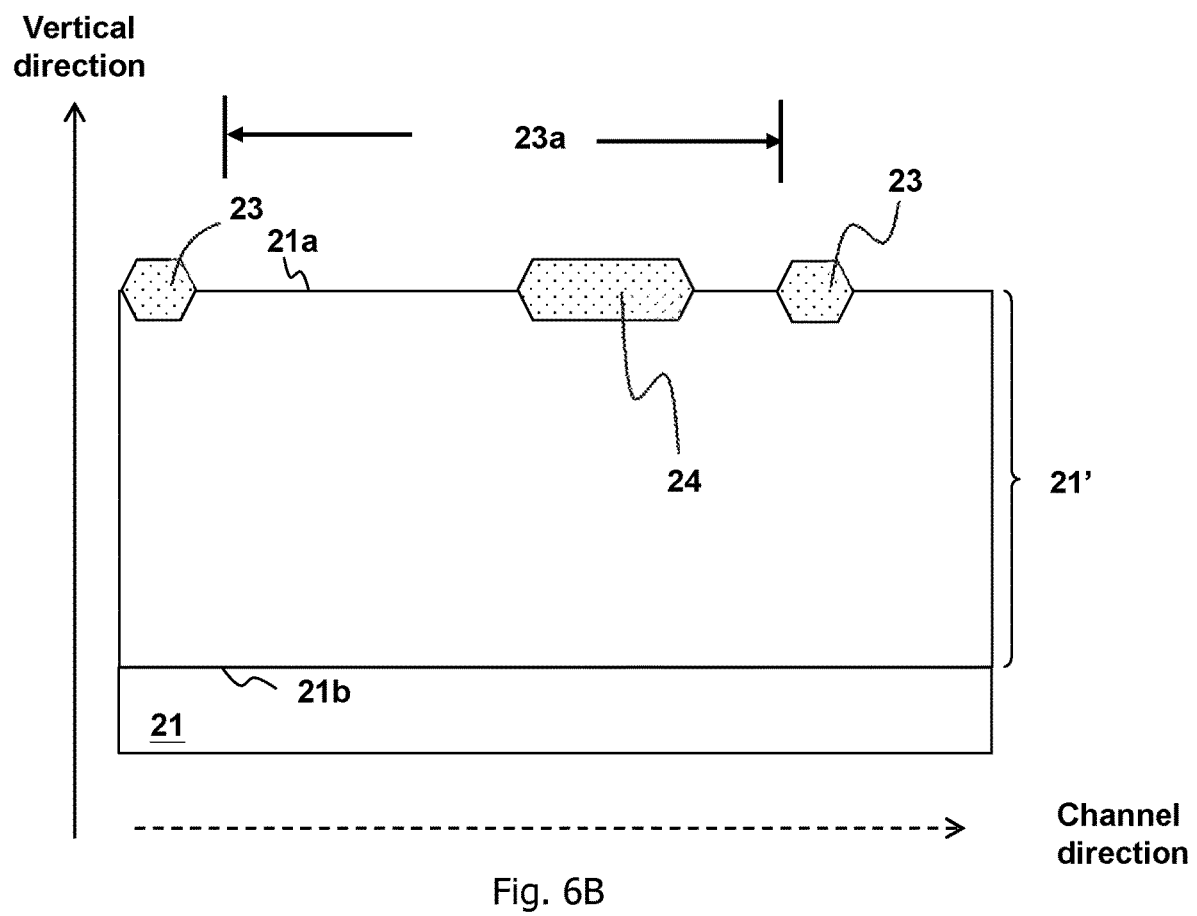

Please refer to FIGS. 6A to 6G, which show a fifth embodiment of the present invention. This embodiment shows schematic diagrams of a manufacturing method of the high voltage device 200 according to the present invention. FIG. 6B shows a schematic diagram of a cross-section view according to the cross-section line A-A' shown in FIG. 6A. As shown in FIGS. 6A and 6B, first, the semiconductor layer 21' is formed on the substrate 21, wherein the semiconductor layer 21' has a top surface 21*a* and a bottom surface 21*b* that is opposite to the top surface 21*a* in the vertical direction (as indicated by the direction of the solid arrow in FIG. 6B). The substrate 21 is, for example but not limited to, a P-type or N-type silicon substrate. The semiconductor layer 21', for example, is formed on the substrate 21 by an epitaxial growth process step, or a part of the substrate 21 is used as the semiconductor layer 21'. The semiconductor layer 41' can be formed by any method known to a person having ordinary skill in the art, so the details thereof are not redundantly explained here.

Still referring to FIGS. 6A and 6B, next, the isolation structure 23 and the drift oxide region 24 are formed on the top surface 21*a* and in contact with the top surface 21*a*. The isolation structure 23 is for defining the device region 23*a* (as indicated by a dashed frame shown in FIG. 6A). The isolation structure 23 is not limited to the local oxidation of silicon (LOCOS) structure as shown in the figure; in other embodiments, it may be a shallow trench isolation (STI) structure instead. The drift oxide region 24 is formed on the top surface 21*a* and in contact with the top surface 21*a*. The drift oxide region 24 is located on the drift region 22*a* (as indicated by the dashed frame shown in FIG. 2) within the device region 23*a*, and is in contact with the drift region 22*a*.

Figure 6C:
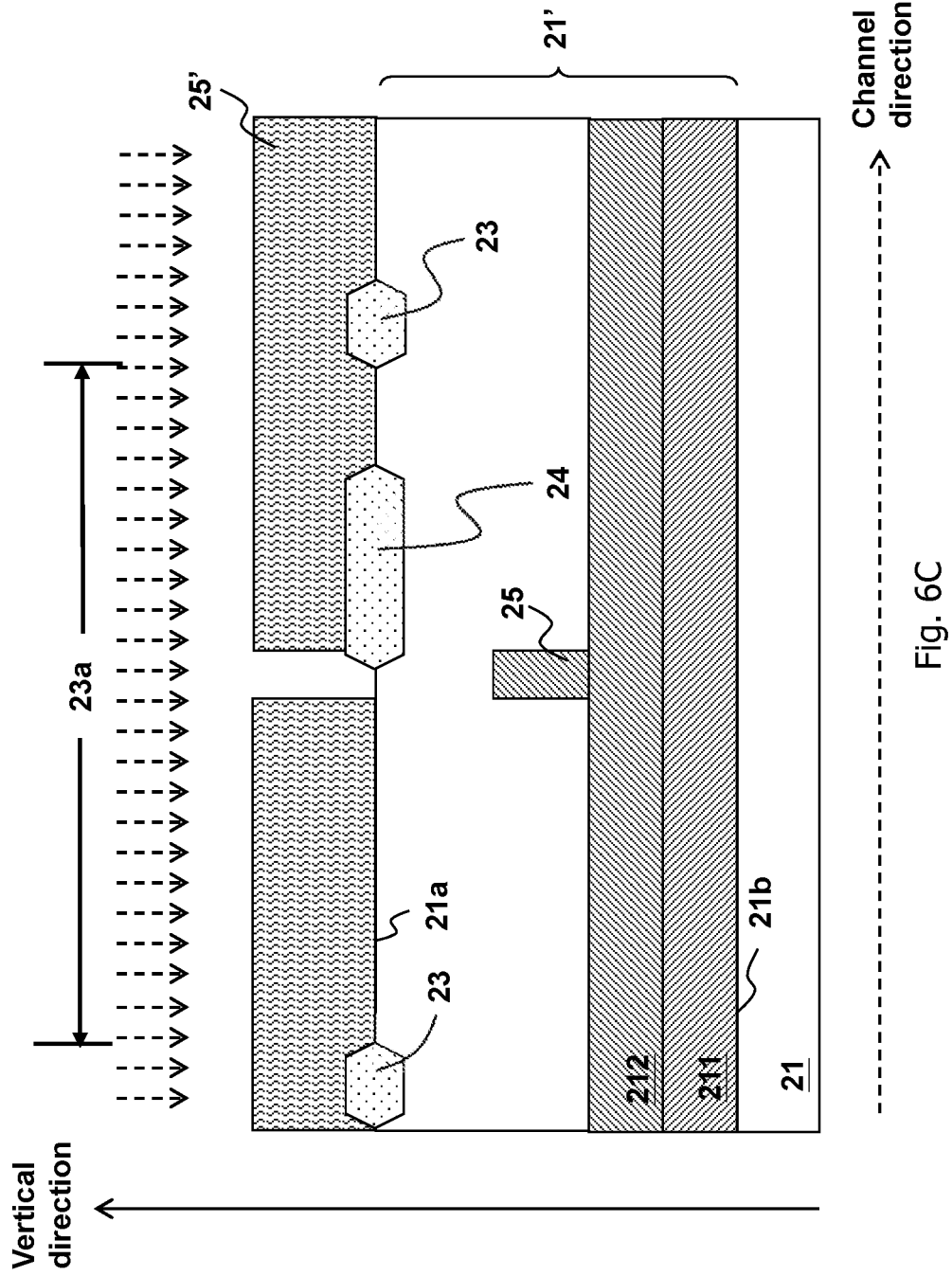

Next, referring to FIG. 6C, the deep well 211 is formed in the semiconductor layer 21', and has a first conductivity type. The deep well 211 can be formed by, for example but not limited to, an ion implantation process step which implants first conductivity type impurities into the semiconductor layer 21' in the form of accelerated ions, to form the deep well 211. The buried layer 212 is formed below the deep well 211 in the semiconductor layer 21', and has a second conductivity type. The buried layer 212 encompasses the lower boundary of the deep well 211, and is in contact with the deep well 211. The buried layer 212 can be formed by, for example but not limited to, an ion implantation process step which implants second conductivity type impurities into the substrate 21 and/or the semiconductor layer 21' in the form of accelerated ions, to form the buried layer 212. For example, when the semiconductor layer 21' is an epitaxial layer formed on the substrate 21, the second conductivity type impurities are implanted into the substrate 21 in the form of accelerated ions, and thereafter the epitaxial layer is formed on the substrate 21 by an epitaxial growth process step to form the semiconductor layer 21', and then the buried layer 212 is formed at or around an interface between the substrate 21 and the semiconductor layer 21' by a thermal process step, wherein part of the second conductivity type impurities diffuse from the substrate 21 to the semiconductor layer 21' in the thermal process step to form the buried layer 212.

Next, still referring to FIG. 6C, the deep well column 25 is formed in the first high voltage well 22 within the device region 23*a*, and has the first conductivity type. The deep well column 25 is in contact with the deep well 211, and is electrically connected to the deep well 211, but is not in contact with the top surface 21*a* in the vertical direction. The deep well column 25 can be formed by, by for example but not limited to, a lithography process step and an ion implantation process step, wherein the lithography process step includes forming a photo-resist layer 25' as a mask, and the ion implantation process step implants first conductivity type impurities into the semiconductor layer 21' in the form of accelerated ions, to form the deep well column 25.

Figure 6D:
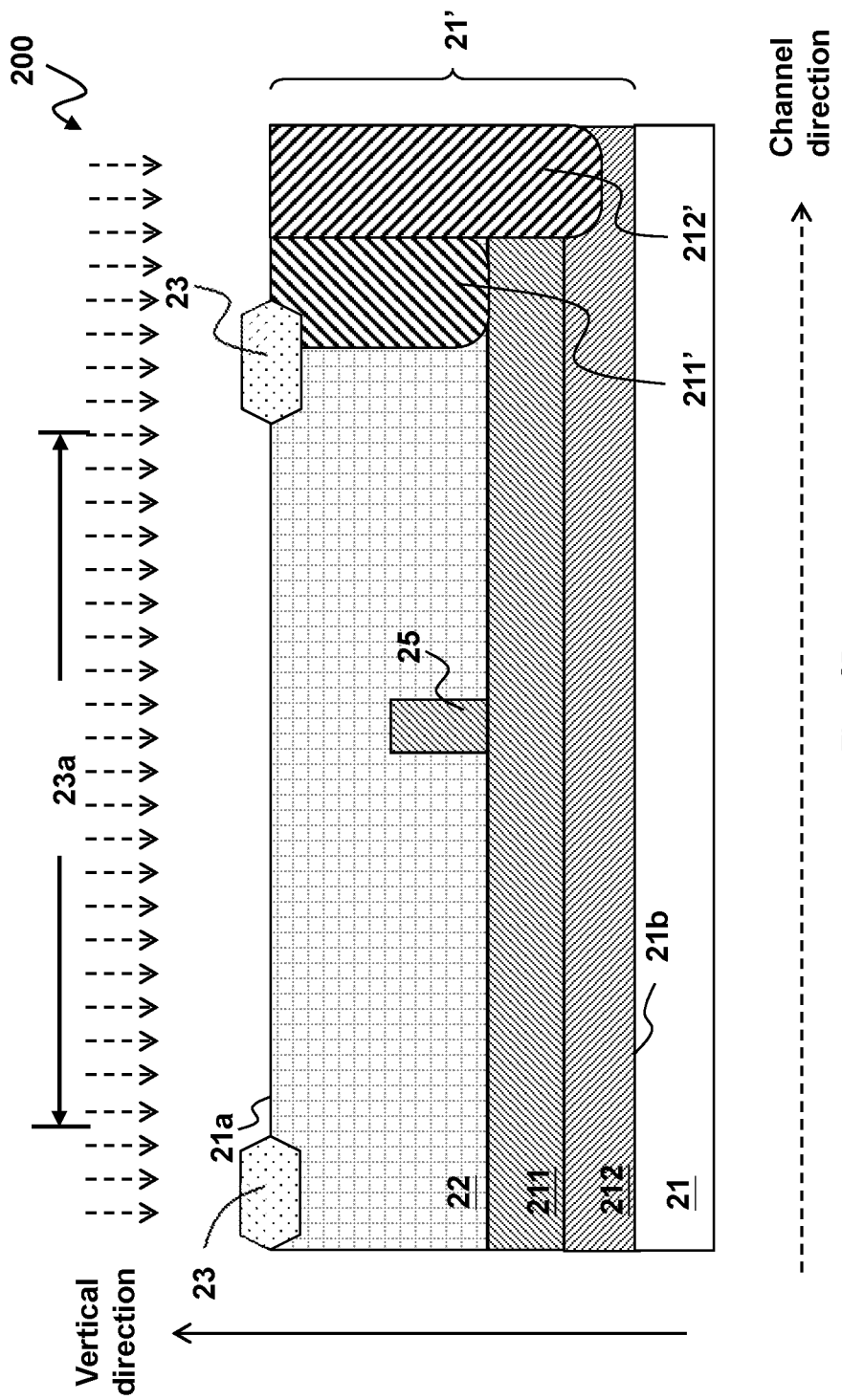

Next, referring to FIG. 6D, the first high voltage well 22 is formed on the deep well 211 in the semiconductor layer 21', and has the second conductivity type. The first high voltage well 22 overlays an upper boundary of the deep well 211 and is in contact with the deep well 211, and the first high voltage well 22 is below and in contact with the top surface 21*a* in the vertical direction. The first high voltage well 22 can be formed by, by for example but not limited to, an ion implantation process step which implants second conductivity type impurities into the semiconductor layer 21' in the form of accelerated ions as indicated by dashed arrows shown in FIG. 6D, to form the first high voltage well 22.

Next, still referring to FIG. 6D, the first conductivity type well 211' is formed in the first high voltage well 22 outside the device region 23*a*, and has the first conductivity type. The first conductivity type well 211' is located below the top surface 21*a* and in contact with the top surface 21*a* in the vertical direction. The first conductivity type well 211' is in contact with the deep well 211 and is electrically connected to the deep well 211. The second high voltage well 212' is formed in the first high voltage well 22 outside the device region 23*a*, and has the second conductivity type. The second high voltage well 212' is located below the top surface 21*a* and in contact with the top surface 21*a* in the vertical direction. The second high voltage well 212' is in contact with the buried layer 212, and is electrically connected to the buried layer 212.

Figure 6E:
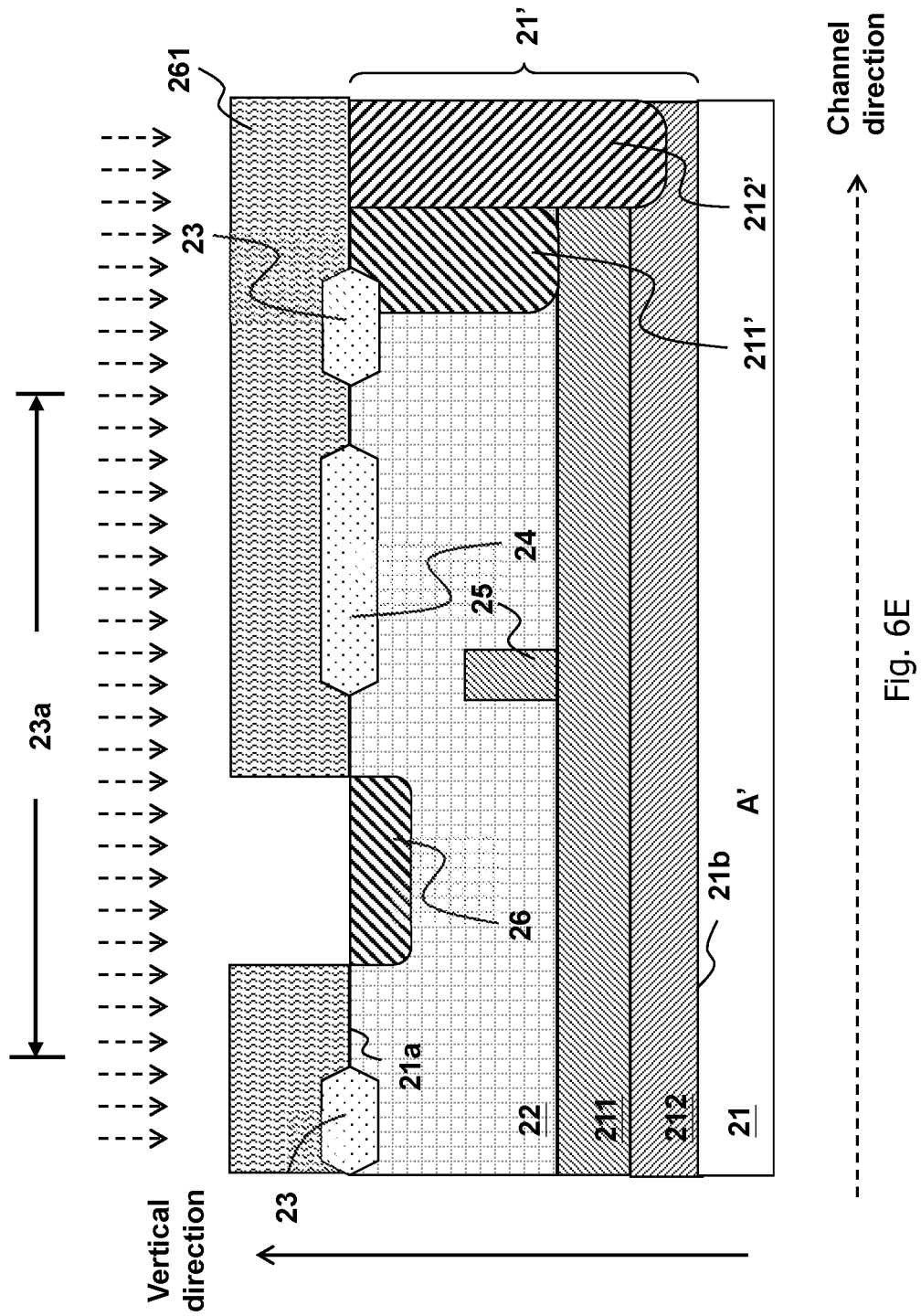

Next, referring to FIG. 6E, the body region 26 is formed in the first high voltage well 22 within the device region 23*a*, and has the first conductivity type. The body region 26 is located below the top surface 21*a* and in contact with the top surface 21*a* in the vertical direction. The body region 26 can be formed by, by for example but not limited to, a lithography process step and an ion implantation process step, wherein the lithography process step includes forming a photo-resist layer 261 as a mask, and the ion implantation process step implants first conductivity type impurities into the first high voltage well 22 in the form of accelerated ions, to form the body region 26.

Figure 6F:
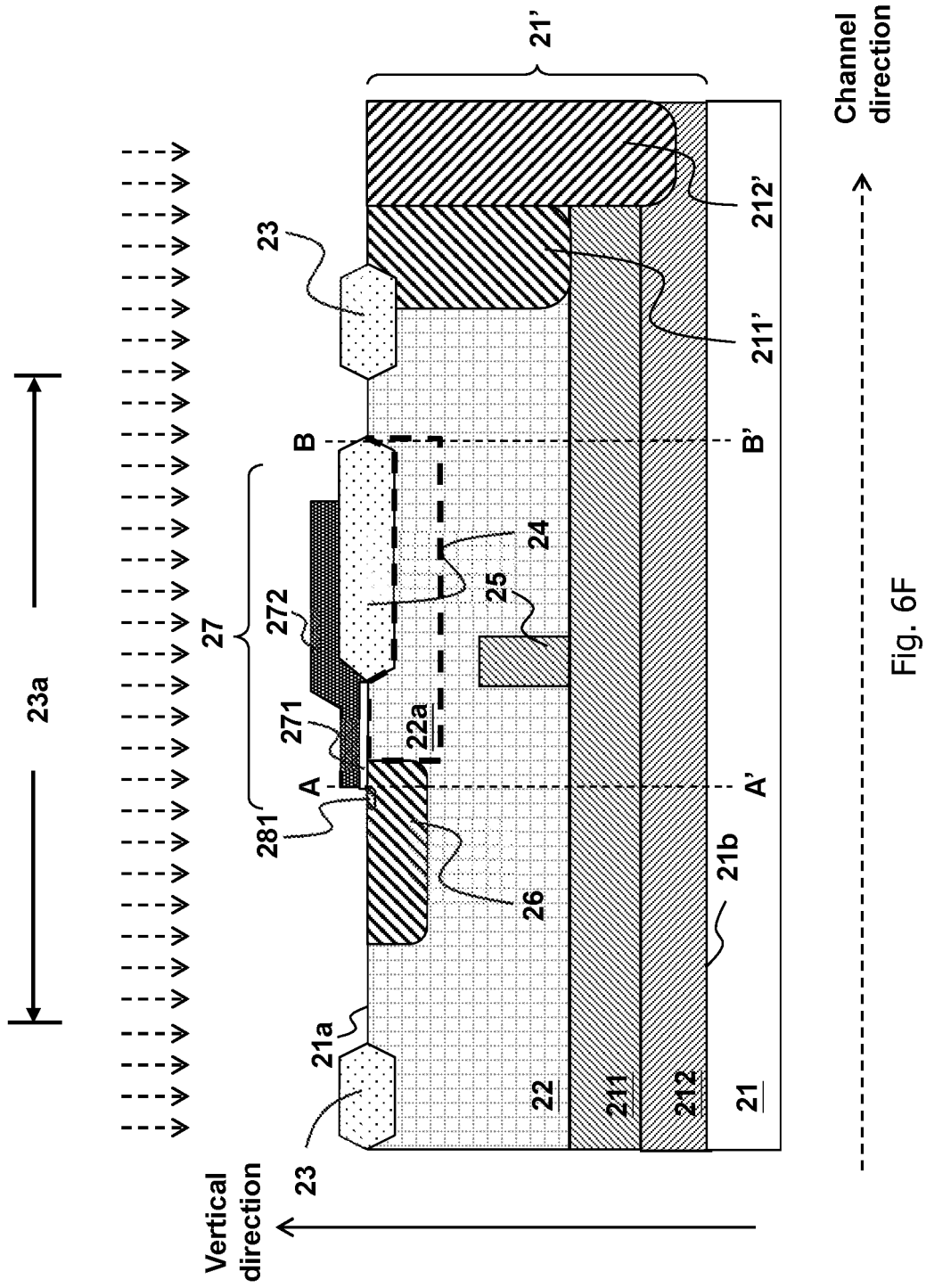

Next, referring to FIG. 6F, the dielectric layer 271 and the conductive layer 272 of the gate 27 is formed on the top surface 21*a* within the device region 23*a*, wherein part of the body region 26 is located below and in contact with the gate 27 in the vertical direction, to serve as the inversion current channel in the ON operation of the high voltage device 200.

Next, still referring to FIG. 6F, in one embodiment, a lightly doped region 281 is formed after the dielectric layer 271 and the conductive layer 272 of the gate 27 are formed, wherein the lightly doped region 281 is for forming a current flowing channel right below the spacer layer 273, to ensure that the inversion current channel can be formed in the ON operation of the device. The lightly doped region 281 can be formed by, by for example but not limited to, an ion implantation process step which implants second conductivity type impurities into the body region 26 in the form of accelerated ions as indicated by dashed arrows shown in FIG. 6F, to form the lightly doped region 281.

Figure 6G:
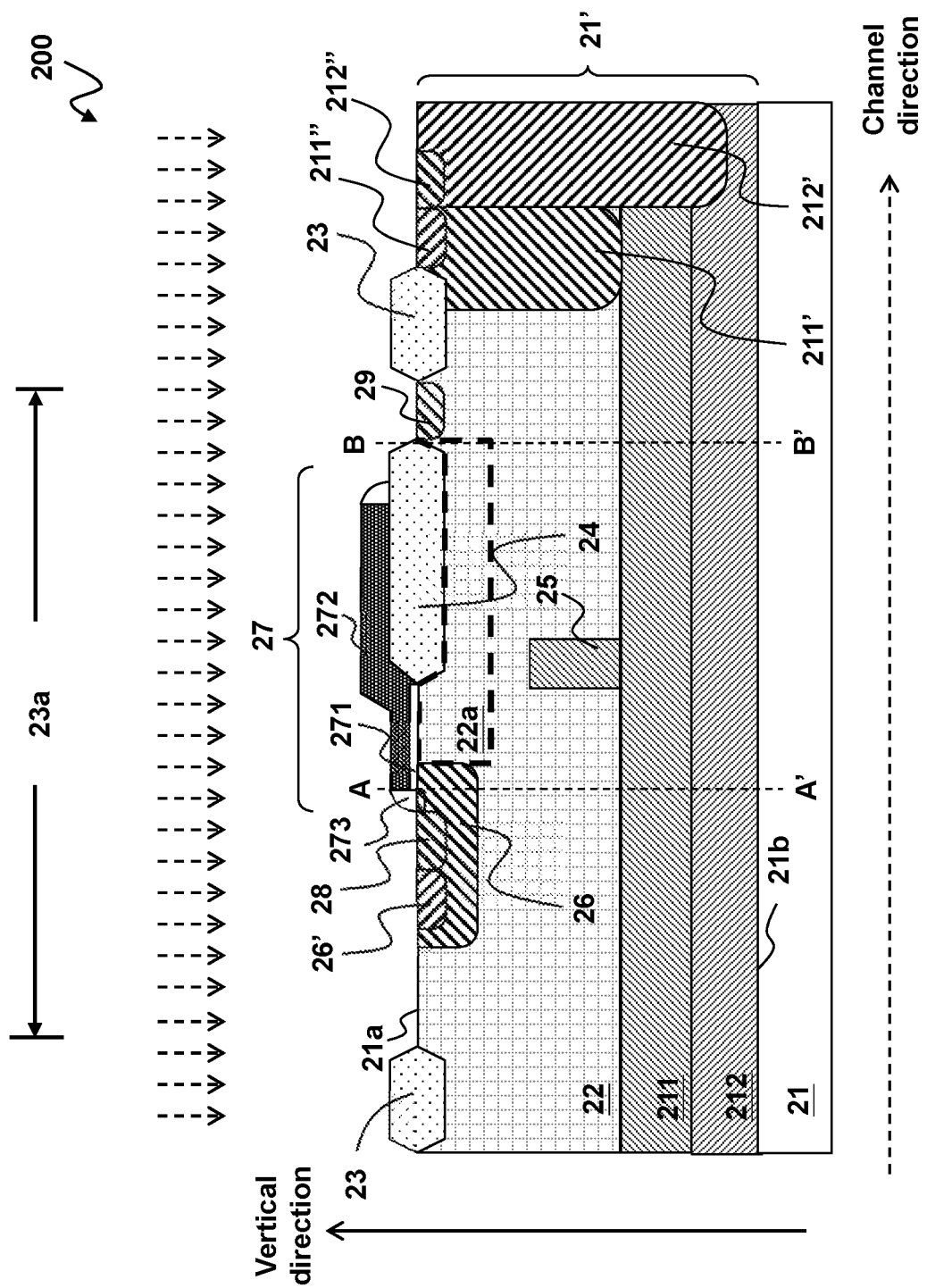

Next, referring to FIG. 6G, the spacer 273 is formed outside the sidewalls of the conductive layer 272. Next, the body contact 26', the source 28, the drain 29, the first conductivity type contact 211", and the second conductivity type contact 212" are formed below and in contact with the upper surface 21a in the device region 23a. The source 28 and the drain 29 have the second conductivity type. The source 28 and the drain 29 are located below and outside two sides of the gate 27 respectively, wherein the source 28 is located in the body region 26, and the drain 29 is located in the first high voltage well 22, at a location near the right side of the gate 27 (i.e., the side that is away from the body region 26). The drift region 22a is located in the first high voltage well 22 between the drain 29 and the body region 26 in the channel direction and in contact with the top surface 21a, to serve as the drift current channel in the ON operation of the high voltage device 200. The source 28 and the drain 29 are formed below the top surface 21a and in contact with the top surface 21a in the vertical direction. The second conductivity type contact 212" is formed in the second conductivity type well 212', and has the second conductivity type. The second conductivity type contact 212" is located below the top surface 21a and in contact with the top surface 21a in the vertical direction, to serve as an electrical contact of the second conductivity type well 212'. The second conductivity type contact 212", the source 28, and the drain 29 have the second conductivity type. The source 28 and the drain 29 can be formed by, by for example but not limited to, a lithography process step and an ion implantation process step, wherein the lithography process step includes forming a photo-resist layer as a mask, and the ion implantation process step implants second conductivity type impurities into the body region 26 and the first high voltage well 22 in the form of accelerated ions as indicated by dashed arrows shown in FIG. 6G, to form the source 28 and the drain 29.

The first conductivity type contact 211" is formed in the first conductivity type well 211', and has the first conductivity type. The first conductivity type contact 211" is located below the top surface 21a and in contact with the top surface 21a in the vertical direction, to serve as an electrical contact of the first conductivity type well 211'. The body contact 26' is formed in the body region 26, and has the first conductivity type. The body contact 26' is located below the top surface 21a and in contact with the top surface 21a in the vertical direction, wherein the body contact 26' serves as an electrical contact of the body region 26. The first conductivity type contact 211" and the body contact 26' can be formed by, by for example but not limited to, a lithography process step and an ion implantation process step, wherein the lithography process step includes forming a photo-resist layer as a mask, and the ion implantation process step implants first conductivity type impurities into the first conductivity type well 211' and the body region 26 in the form of accelerated ions, to form the first conductivity type contact 211" and the body contact 26'.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a threshold voltage adjustment region, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A high voltage device comprising:
   a semiconductor layer, which is formed on a substrate, and has a top surface and a bottom surface opposite to the top surface in a vertical direction;
   an isolation region, which is formed on and in contact with the top surface, wherein the isolation region is for defining a device region;
   a deep well which has a first conductivity type and is formed in the semiconductor layer;
   a buried layer which has a second conductivity type and is formed below the deep well in the semiconductor layer, wherein the buried layer encompasses a lower boundary of the deep well, and is in contact with the deep well;
   a first high voltage well which has the second conductivity type and is formed on the deep well in the semiconductor layer, wherein the first high voltage well overlays an upper boundary of the deep well and is in contact with the deep well, and the first high voltage well is below and in contact with the top surface in the vertical direction;
   a first conductivity type well which has the first conductivity type and is formed in the first high voltage well outside the device region, wherein the first conductivity type well is located below and in contact with the top surface in the vertical direction, and wherein the first conductivity type well is in contact with the deep well and is electrically connected to the deep well;
   a second high voltage well which has the second conductivity type and is formed in the first high voltage well outside the device region, wherein the second high voltage well is located below and in contact with the top surface in the vertical direction, and wherein the second high voltage well is in contact with the buried layer and is electrically connected to the buried layer;
   a body region which has the first conductivity type and is formed in the first high voltage well within the device region, wherein the body region is located below and in contact with the top surface in the vertical direction;
   a body contact which has the first conductivity type and is formed in the body region, wherein the body contact is located below and in contact with the top surface in the vertical direction, and wherein the body contact serves as an electrical contact of the body region;
   a deep well column which has the first conductivity type and is formed in the first high voltage well within the device region, wherein the deep well column is in contact with the deep well and is electrically connected to the deep well, and wherein the deep well column is not in contact with the top surface in the vertical direction;
   a gate, which is formed on the top surface within the device region, wherein part of the first high voltage well is located below and in contact with the gate in the vertical direction, the gate including:

a dielectric layer, which is formed on and in contact with the top surface, and is in contact with the first high voltage well in the vertical direction;

a conductive layer, which is formed on and in contact with the dielectric layer, and serves as an electrical contact of the gate; and a spacer layer, which is formed outside of two sidewalls of the conductive layer, and serves as an electrical insulation layer of the gate; and a source and a drain which have the second conductivity type and are formed below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the first high voltage well outside the drain side;

wherein an inversion region is formed in the body region between the source and the first high voltage well in a channel direction to serve as an inversion current channel in an ON operation of the high voltage device;

wherein a drift region is formed in the first high voltage well between the drain and the body region in the channel direction to serve as a drift current channel in the ON operation of the high voltage device;

wherein the deep well column is located between the drain and a boundary of the conductive layer near the source side in the channel direction.

2. The high voltage device of claim 1, further comprising a drift oxide region, which is formed on and in contact with the top surface, and is on and in contact with the drift region within the device region, wherein the drift oxide region includes a local oxidation of silicon (LOCOS) structure, a shallow trench isolation (STI) structure, or a chemical vapor deposition (CVD) structure.

3. The high voltage device of claim 1, wherein an upper boundary of the deep well column is deeper than a lower boundary of the body region in the vertical direction.

4. The high voltage device of claim 1, wherein the source, the body region, and the first high voltage well form a parasitic transistor, and the deep well column serves as a minority carriers absorption channel, to avoid turning ON the parasitic transistor.

5. The high voltage device of claim 1, further comprising:

a first conductivity type contact which has the first conductivity type and is formed in the first conductivity type well, wherein the first conductivity type contact is located below and in contact with the top surface in the vertical direction, to serve as an electrical contact of the first conductivity type well; and a second conductivity type contact which has the second conductivity type and is formed in the second conductivity type well, wherein the second conductivity type contact is located below and in contact with the top surface in the vertical direction, to serve as an electrical contact of the second conductivity type well.

6. A manufacturing method of a high voltage device, comprising:

forming a semiconductor layer on a substrate, wherein the semiconductor layer has a top surface and a bottom surface opposite to the top surface in a vertical direction;

forming an isolation region on the top surface for defining a device region, wherein the isolation region is in contact with the top surface;

forming a deep well having a first conductivity type in the semiconductor layer;

forming a buried layer having a second conductivity type below the deep well in the semiconductor layer, wherein the buried layer encompasses a lower boundary of the deep well, and is in contact with the deep well;

forming a first high voltage well having the second conductivity type on the deep well in the semiconductor layer, wherein the first high voltage well overlays an upper boundary of the deep well and is in contact with the deep well, and wherein the first high voltage well is below and in contact with the top surface in the vertical direction;

forming a first conductivity type well having the first conductivity type in the first high voltage well outside the device region, wherein the first conductivity type well is located below and in contact with the top surface in the vertical direction, and wherein the first conductivity type well is in contact with the deep well and is electrically connected to the deep well;

forming a second high voltage well having the second conductivity type in the first high voltage well outside the device region, wherein the second high voltage well is located below and in contact with the top surface in the vertical direction, and wherein the second high voltage well is in contact with the buried layer and is electrically connected to the buried layer;

forming a body region having the first conductivity type in the first high voltage well within the device region, wherein the body region is located below and in contact with the top surface in the vertical direction;

forming a body contact having the first conductivity type in the body region, wherein the body contact is located below and in contact with the top surface in the vertical direction, and wherein the body contact serves as an electrical contact of the body region;

forming a deep well column having the first conductivity type in the first high voltage well within the device region, wherein the deep well column is in contact with the deep well and is electrically connected to the deep well, and wherein the deep well column is not in contact with the top surface in the vertical direction;

forming a gate on the top surface within the device region, wherein part of the first high voltage well is located below and in contact with the gate in the vertical direction, the gate including:

a dielectric layer, which is formed on and in contact with the top surface, and is in contact with the first high voltage well in the vertical direction;

a conductive layer, which is formed on and in contact with the dielectric layer, and serves as an electrical contact of the gate; and a spacer layer, which is formed outside of two sidewalls of the conductive layer, and serves as an electrical insulation layer of the gate; and forming a source and a drain having the second conductivity type below and in contact with the top surface in the vertical direction within the device region, wherein the source and the drain are located below and outside two sides of the gate respectively, wherein the side of the gate which is closer to the source is a source side and the side of the gate which is closer to the drain is a drain side, and wherein the source is located in the body region, and the drain is located in the first high voltage well outside the drain side;

wherein an inversion region is formed in the body region between the source and the first high voltage well in a channel direction to serve as an inversion current channel in an ON operation of the high voltage device;

wherein a drift region is formed in the first high voltage well between the drain and the body region in the channel direction to serve as a drift current channel in the ON operation of the high voltage device;

wherein the deep well column is located between the drain and a boundary of the conductive layer near the source side in the channel direction.

7. The manufacturing method of the high voltage device of claim 6, further comprising: forming a drift oxide region on the top surface, wherein the drift oxide region is in contact with the top surface, and is on and in contact with the drift region within the device region, wherein the drift oxide region includes a local oxidation of silicon (LOCOS) structure, a shallow trench isolation (STI) structure, or a chemical vapor deposition (CVD) structure.

8. The manufacturing method of the high voltage device of claim 6, wherein an upper boundary of the deep well column is deeper than a lower boundary of the body region in the vertical direction.

9. The manufacturing method of the high voltage device of claim 6, wherein the source, the body region, and the first high voltage well form a parasitic transistor, and the deep well column serves as a minority carriers absorption channel, to avoid turning ON the parasitic transistor.

10. The manufacturing method of the high voltage device of claim 6, further comprising:

forming a first conductivity type contact which has the first conductivity type in the first conductivity type well, wherein the first conductivity type contact is located below and in contact with the top surface in the vertical direction, to serve as an electrical contact of the first conductivity type well; and forming a second conductivity type contact which has the second conductivity type in the second conductivity type well, wherein the second conductivity type contact is located below and in contact with the top surface in the vertical direction, to serve as an electrical contact of the second conductivity type well.

* * * * *